(12) United States Patent
Koyanagi et al.

(10) Patent No.: US 10,854,774 B2
(45) Date of Patent: Dec. 1, 2020

(54) LIFT-OFF METHOD

(71) Applicant: DISCO CORPORATION, Tokyo (JP)

(72) Inventors: Tasuku Koyanagi, Tokyo (JP); Hiroki Takeuchi, Tokyo (JP)

(73) Assignee: DISCO CORPORATION, Tokyo (JP)

(*) Notice: Subject to any disclaimer, the term of this patent is extended or adjusted under 35 U.S.C. 154(b) by 0 days.

(21) Appl. No.: 16/159,137

(22) Filed: Oct. 12, 2018

(65) Prior Publication Data

US 2019/0115494 A1 Apr. 18, 2019

(30) Foreign Application Priority Data

Oct. 17, 2017 (JP) .................................. 2017-201299

(51) Int. Cl.
*H01L 33/00* (2010.01)
*H01S 5/30* (2006.01)
*H01S 5/02* (2006.01)

(52) U.S. Cl.
CPC ...... *H01L 33/0093* (2020.05); *H01L 33/0075* (2013.01); *H01L 33/0095* (2013.01); *H01S 5/0216* (2013.01); *H01S 5/0217* (2013.01); *H01S 5/3013* (2013.01)

(58) Field of Classification Search
CPC .................. H01L 33/0079; H01L 33/0093
USPC .......................................................... 438/22
See application file for complete search history.

(56) References Cited

U.S. PATENT DOCUMENTS

| | | | |
|---|---|---|---|
| 2015/0221818 A1* | 8/2015 | Morikazu | H01L 33/0066 438/22 |
| 2016/0013613 A1* | 1/2016 | Koyanagi | H01L 33/0079 156/712 |

FOREIGN PATENT DOCUMENTS

| | | |
|---|---|---|
| JP | 10305420 A | 11/1998 |
| JP | 2004072052 A | 3/2004 |
| JP | 2011103361 A | 5/2011 |

* cited by examiner

*Primary Examiner* — Hsin Yi Hsieh
(74) *Attorney, Agent, or Firm* — Greer Burns & Crain Ltd.

(57) ABSTRACT

A lift-off method transfers onto a transfer substrate an optical device layer of an optical device wafer in which the optical device layer is formed over a front surface of an epitaxy substrate through a GaN buffer layer. The lift-off method includes: bonding the transfer substrate onto a front surface of the optical device layer through a bonding layer to form a composite substrate; applying a pulsed laser beam of such a wavelength as to be transferred through the epitaxy substrate constituting the composite substrate but to be absorbed in the buffer layer from a back surface side of the epitaxy substrate, to break the buffer layer; and peeling the optical device layer from the epitaxy substrate and transferring the optical device layer onto the transfer substrate, after the buffer layer breaking step is performed.

7 Claims, 6 Drawing Sheets

LIFT-OFF METHOD

BACKGROUND OF THE INVENTION

Field of the Invention

The present invention relates to a lift-off method for transferring onto a transfer substrate an optical device layer of an optical device wafer in which the optical device layer is formed over a front surface of an epitaxy substrate, such as a sapphire substrate or a silicon carbide substrate, through a buffer layer.

Description of the Related Art

In an optical device manufacturing process, an optical device layer including an n-type semiconductor layer and a p-type semiconductor layer composed of gallium nitride (GaN) or the like are formed over a front surface of an epitaxy substrate such as a sapphire substrate or a silicon carbide substrate in the form of a substantially circular plate through a buffer layer, and optical devices such as a light emitting diode (LED) or a laser diode (LD) are formed in a plurality of regions partitioned by a plurality of division lines (streets) formed in a grid pattern, to manufacture an optical device wafer. Then, the optical device wafer is divided along the division lines, to manufacture individual optical device chips (see, for example, Japanese Patent Laid-open No. H10-3054205).

In addition, as a technology for enhancing the luminance of an optical device chip, a manufacturing method called lift-off method is described in Japanese Patent Laid-open No. 2004-72052. In this method, an optical device layer of an optical device wafer is bonded to a transfer substrate formed from Cu, Mo, Si, or the like through a bonding layer of AuSn (gold-tin) or the like, then, a pulsed laser beam of such a wavelength as to be transmitted through an epitaxy substrate but to be absorbed in a buffer layer is applied from a back surface side of the epitaxy substrate to break the buffer layer, and to peel the optical device layer from the epitaxy substrate, thereby transferring the optical device layer onto the transfer substrate.

In the well-known lift-off method in which an optical device layer formed over an epitaxy substrate is transferred onto a transfer substrate, a back surface of the epitaxy substrate is ground to thin the epitaxy substrate to a thickness of substantially 100 to 350 μm, and thereafter, a pulsed laser beam is applied from the back surface side of the epitaxy substrate.

SUMMARY OF THE INVENTION

However, in the method in which the pulsed laser beam is applied after the epitaxy substrate is sufficiently thinned by grinding, there are some problems that, when the epitaxy substrate has a size of 6 inches or larger, for example, a grinding amount is increased, thereby consuming a lot of time for grinding, or the epitaxy substrate is warped severely, so that it is difficult to achieve sufficient thinning.

In addition, in the method in which the pulsed laser beam is applied from the back surface side of the epitaxy substrate, it may be impossible to sufficiently break the buffer layer, and it is impossible to smoothly peel the optical device layer from the epitaxy substrate.

In view of this, Patent Document 3 proposes a method in which an ultrasonic horn for generating an ultrasonic vibration is put into contact with the epitaxy substrate, to vibrate the epitaxy substrate, thereby peeling the optical device layer from the epitaxy substrate. In this method, however, it is necessary to apply ultrasonic waves as an external force for transferring the optical device layer onto the transfer substrate after breaking the buffer layer.

It is therefore an object of the present invention to provide a lift-off method by which a step of breaking a buffer layer of an epitaxy substrate thicker than ones in the past and a step of transferring an optical device layer can be performed efficiently.

In accordance with an aspect of the present invention, there is provided a lift-off method of transferring onto a transfer substrate an optical device layer of an optical device wafer having the optical device layer formed over a front surface of an epitaxy substrate through a GaN buffer layer. The lift-off method includes a transfer substrate bonding step of bonding the transfer substrate onto a front surface of the optical device layer of the optical device wafer through a bonding layer, to form a composite substrate, a buffer layer breaking step of applying a pulsed laser beam of such a wavelength as to be transmitted through the epitaxy substrate of the optical device wafer constituting the composite substrate but to be absorbed in the buffer layer to the epitaxy substrate from a back surface side of the epitaxy substrate, to break the buffer layer, and an optical device layer transferring step of peeling the optical device layer from the epitaxy substrate and transferring the optical device layer onto the transfer substrate, after the buffer layer breaking step is performed. In the buffer layer breaking step, after application of the pulsed laser beam to a central portion of the epitaxy substrate is performed, application of the pulsed laser beam to a peripheral portion of the epitaxy substrate is performed, whereby the optical device layer is peeled from the epitaxy substrate, and transferred onto the transfer substrate, by a reaction force generated when a stress generated by separation of GaN constituting the buffer layer into Ga and $N_2$ gas is relieved simultaneously with end of the buffer layer breaking step.

Preferably, the epitaxy substrate has a thickness in a range of 0.5 to 1.5 mm.

According to the lift-off method of the present invention, in the buffer layer breaking step, after the application of the pulsed laser beam to a central portion of the epitaxy substrate is performed, the application of the pulsed laser beam to a peripheral portion of the epitaxy substrate is performed. Therefore, while the stress generated due to separation of GaN constituting the buffer layer into Ga and $N_2$ gas is confined inside the substrate in the buffer layer breaking step for the central portion of the epitaxy substrate, the stress is relieved simultaneously with the end of the buffer layer breaking step for the peripheral portion carried out subsequently, so that the optical device layer can be peeled from the epitaxy substrate and transferred onto the transfer substrate by the reaction force of the relieved stress.

Accordingly, a lift-off processing of the optical device layer can be performed even in the case of a thick epitaxy substrate. Hence, it is unnecessary to grind the epitaxy substrate, so that the cost and the number of steps needed for grinding in the past are reduced, and enhanced productivity can be realized.

In addition, since the epitaxy substrate is thick, a risk of cracking of the epitaxy substrate during processing due to generation of the stress and a risk of cracking during carrying after the processing are reduced, and the epitaxy substrate can be reused, leading to a reduction in cost.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
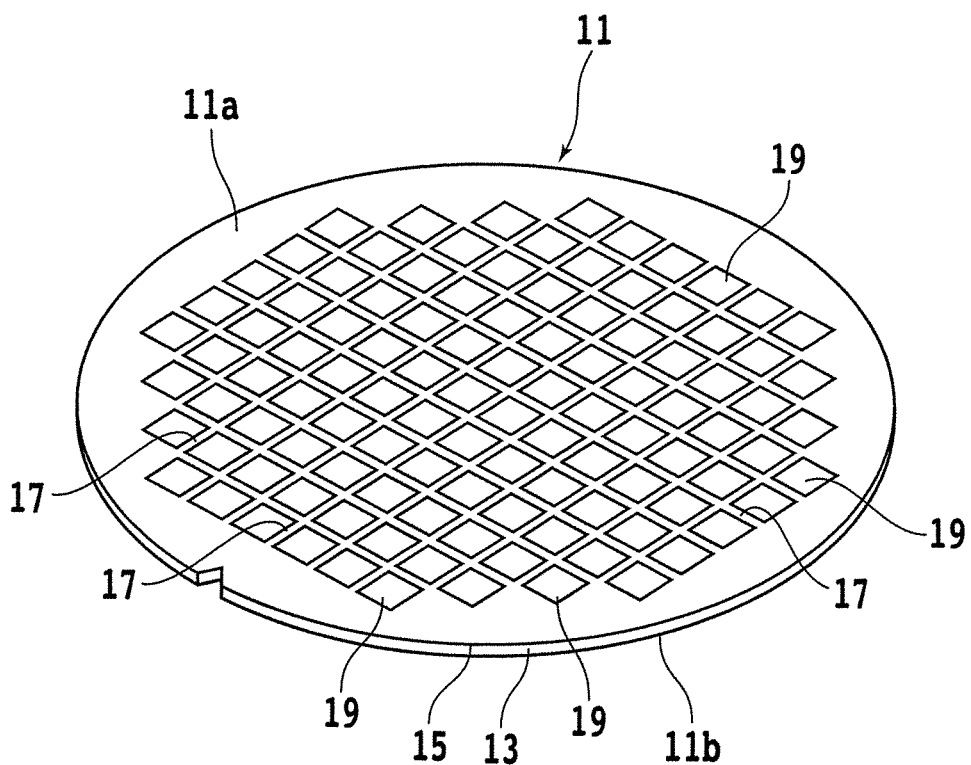
FIG. 1A is a perspective view of an optical device wafer.
Figure 1B:
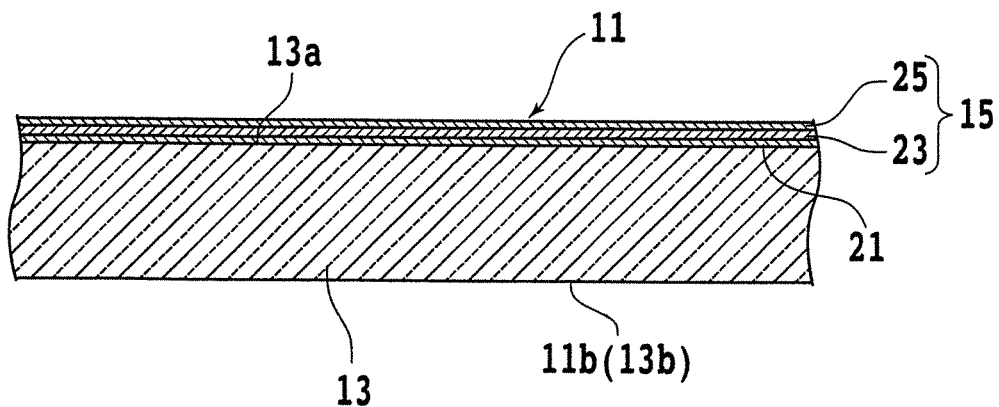
FIG. 1B is a partial enlarged sectional view of the optical device wafer.

Embodiments of the present invention will be described in detail below, referring to the drawings. FIG. 1A illustrates a perspective view of an optical device wafer 11 formed with an optical device layer to be transferred onto a transfer substrate by a lift-off method according to the present invention. FIG. 1B is a partial enlarged sectional view of the optical device wafer 11.

The optical device wafer 11 illustrated in FIG. 1A is configured by forming an optical device layer (epitaxial layer) 15 of gallium nitride (GaN) or the like over a front surface of a sapphire substrate 13 serving as an epitaxy substrate in a circular plate shape having a diameter of 50 mm and a thickness of 1 mm. As illustrated in FIG. 1B, a buffer layer 21 formed of gallium nitride (GaN) and having a thickness of, for example, 1 µm is formed on the front surface of the sapphire substrate 13. The buffer layer 21 is formed through film formation at a low temperature of substantially 500° C., thereby being called a low-temperature buffer layer which is a comparatively soft film with crystallinity broken.

Over the buffer layer 21, the optical device layer 15 including an n-type gallium nitride semiconductor layer 23 and a p-type gallium nitride semiconductor layer 25 is formed by epitaxial growth. The optical device layer (epitaxial layer) 15 formed over the sapphire substrate 13 is formed with a plurality of optical devices 19 such as light emitting diodes (LEDs), in a state of being partitioned by a plurality of division lines (streets) 17 formed in a grid pattern.

Figure 2A:
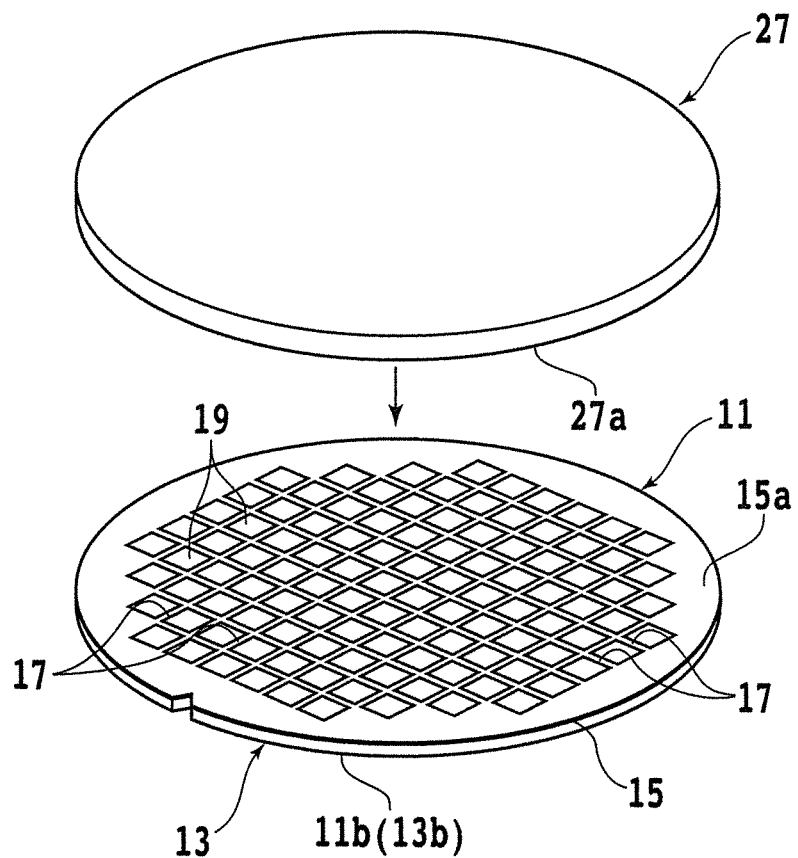
FIG. 2A is a perspective view illustrating a transfer substrate bonding step.
Figure 3:
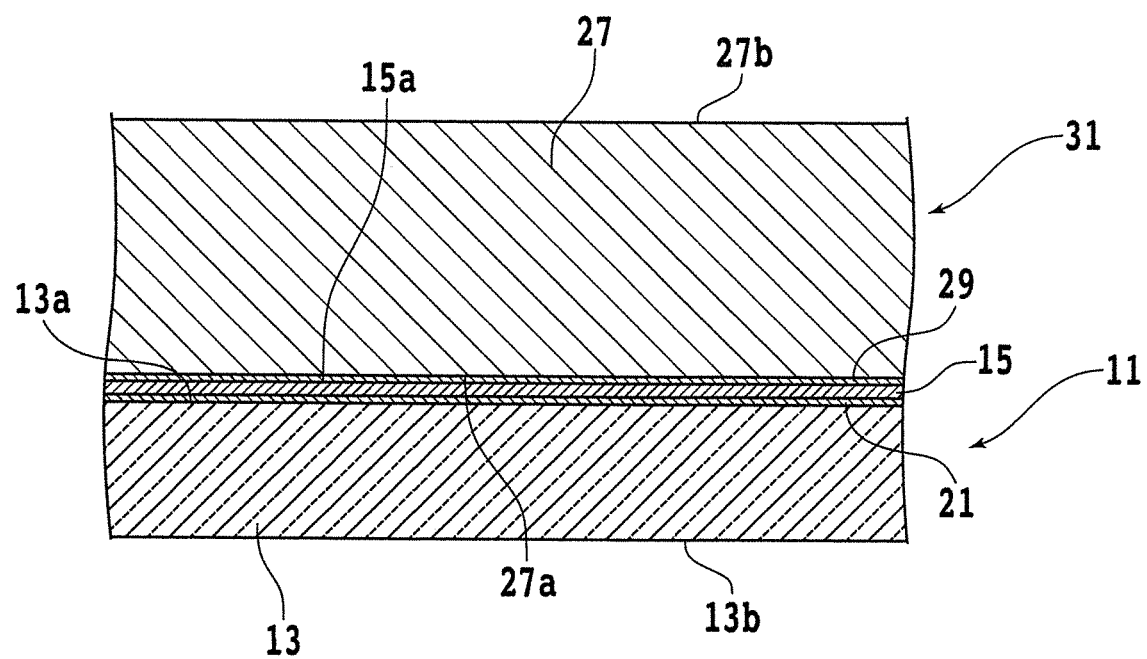
FIG. 3 is a partial enlarged sectional view of the composite substrate.

According to the lift-off method in an embodiment of the present invention, first, a transfer substrate bonding step of bonding a transfer substrate 27 to a front surface 15a of the optical device layer 15 of the optical device wafer 11 as illustrated in FIG. 2A is carried out as a first step. In the present embodiment, as illustrated in FIG. 3, a front surface 27a of the transfer substrate 27 composed of a copper substrate having a thickness of 1 mm is bonded through a bonding metal layer 29 formed of gold-tin (AuSn). Note that the transfer substrate 27 may use molybdenum (Mo), silicon (Si) and the like and a bonding metal for forming the bonding metal layer 29 may use gold (Au), platinum (Pt), chromium (Cr), indium (In), palladium (Pd), and the like.

Figure 2B:
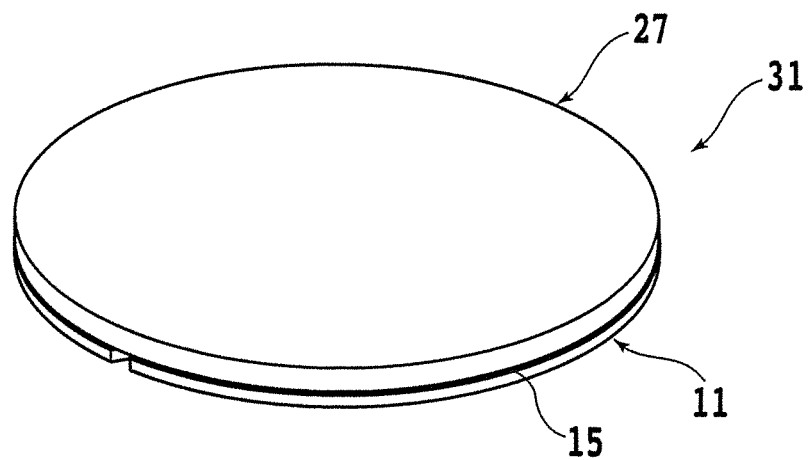
FIG. 2B is a perspective view of a composite substrate formed by bonding a transfer substrate to the optical device wafer.

In the transfer substrate bonding step, the bonding metal described above is vapor-deposited over the front surface 15a of the optical device layer 15, which is formed over the front surface 13a of the sapphire substrate 13, or over the front surface 27a of the transfer substrate 27 to form the bonding metal layer 29 having a thickness of substantially 3 µm, and the bonding metal layer 29 and the front surface 27a of the transfer substrate 27 or the front surface 15a of the optical device layer 15 are made to face each other and are press bonded, whereby the transfer substrate 27 is bonded to the optical device layer 15 of the optical device wafer 11 through the bonding metal layer 29, thereby forming a composite substrate 31 as illustrated in FIG. 2B.

After the transfer substrate bonding step is performed, a buffer layer breaking step is carried out in which a pulsed laser beam having such a wavelength as to be transmitted through the sapphire substrate 13 but to be absorbed in the buffer layer 21 is applied to the sapphire substrate 13 from a back surface 13b side of the sapphire substrate 13, to break the buffer layer 21.

Preferably, in the buffer layer breaking step, the pulsed laser beam is applied from the back surface 13b side of the sapphire substrate 13, with a focal point of the pulsed laser beam positioned inside the sapphire substrate 13 on a laser source side of the buffer layer 21. In this case, the pulsed laser beam may be applied with the focal point of the pulsed laser beam positioned in the buffer layer 21, by controlling output of the pulsed laser beam.

Figure 4:
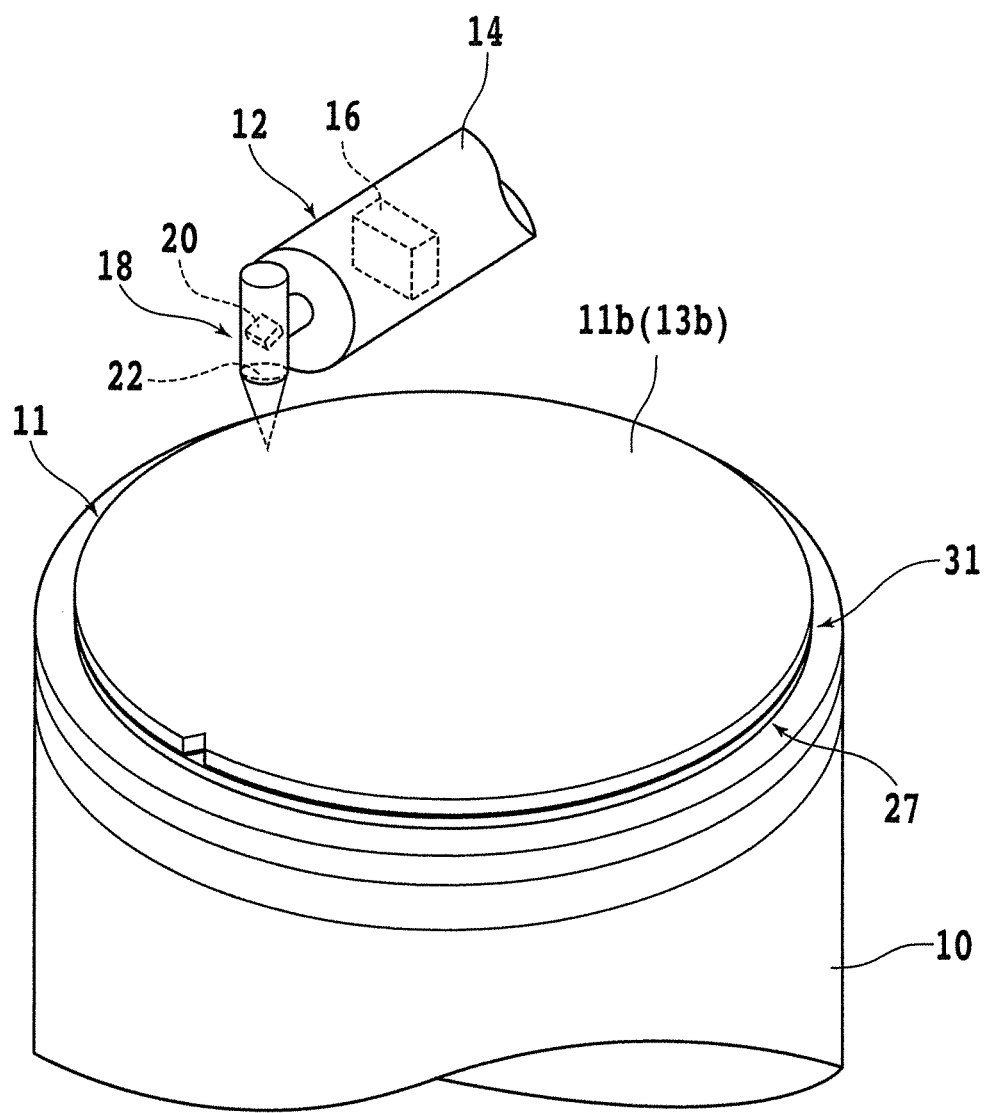
FIG. 4 is a perspective view illustrating a buffer layer breaking step.
Figure 5:
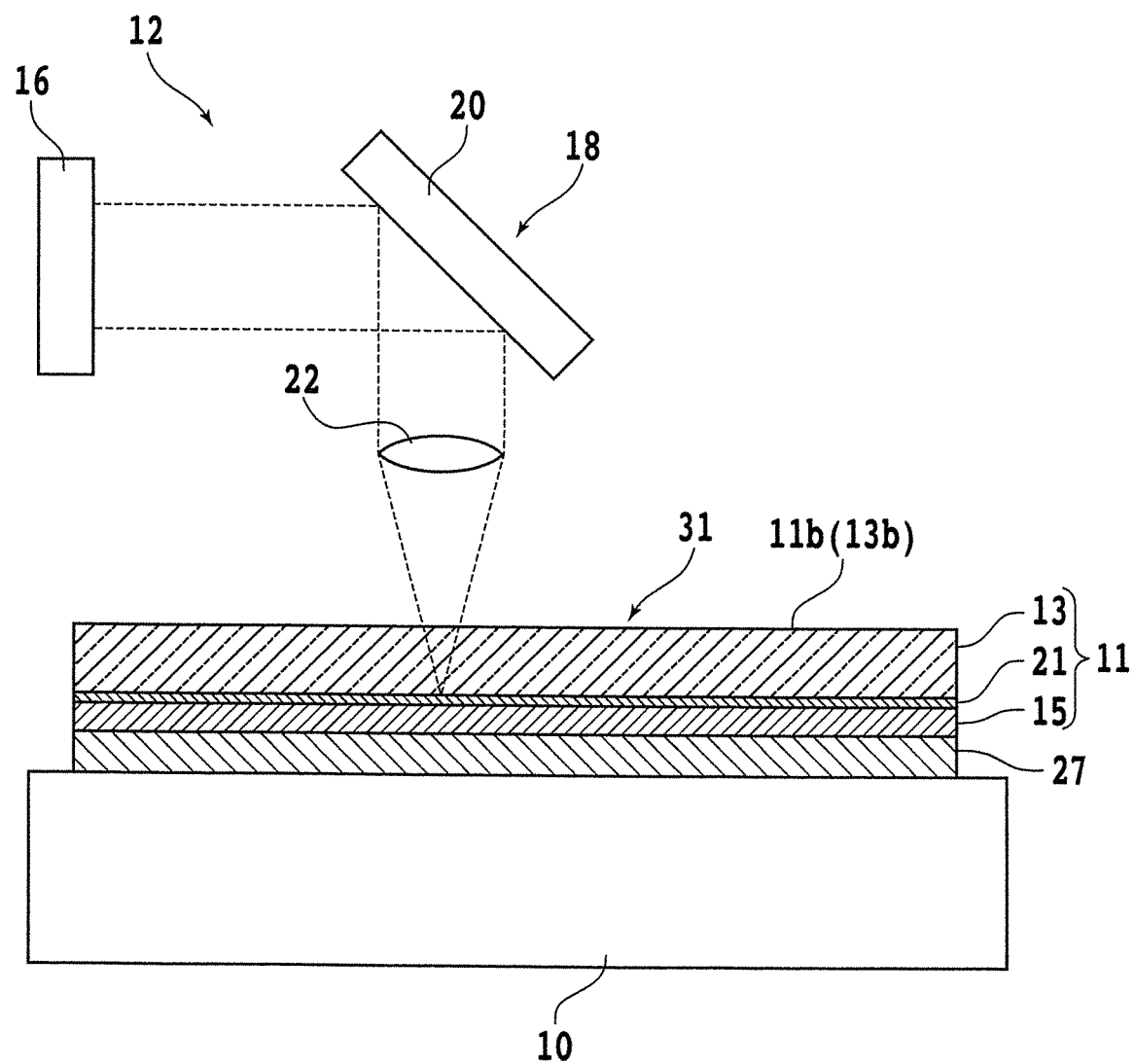
FIG. 5 is a partially sectional side view illustrating the buffer layer breaking step.

FIG. 4 is a perspective view of the buffer layer breaking step, and FIG. 5 is a partially sectional side view of the buffer layer breaking step. As illustrated in FIG. 4, a laser beam applying unit 12 includes a laser beam generating unit 16 accommodated in a substantially cylindrical casing 14, and a condenser 18 mounted to a tip of the casing 14. The laser beam generating unit 16 has a well-known configuration which includes a laser oscillator including YAG or YVO4, repetition frequency setting means, pulse width control means, power control means, and the like.

The condenser 18 includes a Galvano mirror 20 reflecting a laser beam generated from the laser beam generating unit 16, and a focusing lens 22 focusing the laser beam reflected by the Galvano mirror 20. The composite substrate 31 having the transfer substrate 27 bonded to the optical device wafer 11 is held under suction on a chuck table 10 which stands still.

In FIGS. 4 and 5, while the focusing lens 22 is drawn to be considerably small as compared to a size of the composite substrate 31 held on the chuck table 10, the focusing lens 22 in practice preferably has a diameter substantially equivalent to the diameter of the optical device wafer 11, in order that the laser beam can be scanned over the whole surface of the optical device wafer 11 standing still by changing an angle of the Galvano mirror 20.

Figure 6A:
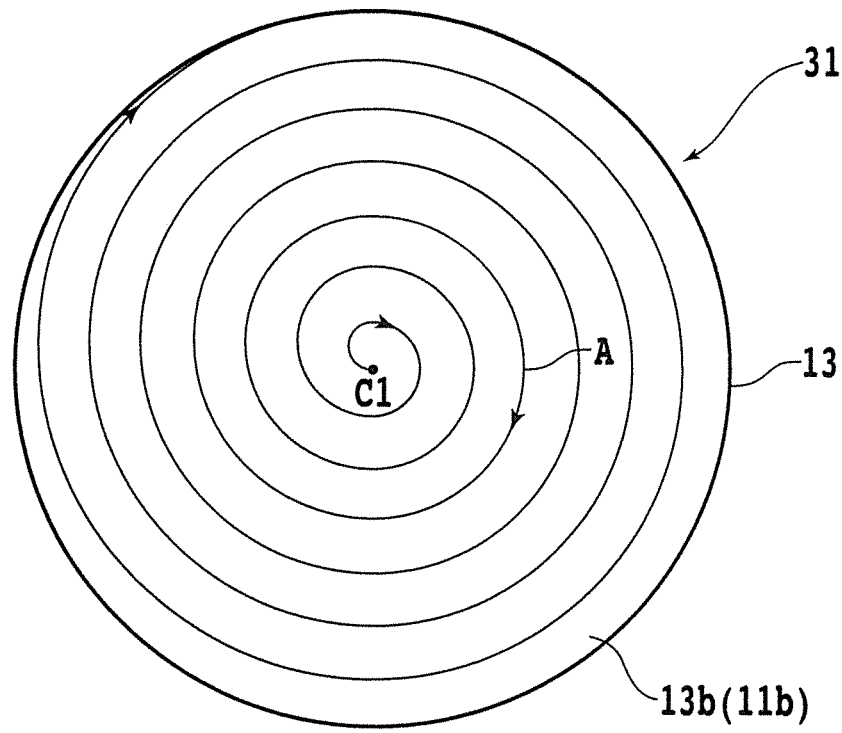
FIG. 6A is a schematic plan view illustrating a first embodiment in which the buffer layer breaking step is conducted spirally from an inner peripheral portion toward an outer peripheral portion of an epitaxy substrate.

According to the lift-off method of the present invention, a laser beam applying method in the buffer layer breaking step is important. In a first embodiment illustrated in FIG. 6A, the pulsed laser beam is applied from the back surface 13b side of the sapphire substrate 13 serving as an epitaxy substrate, in such a manner as to form a spiral locus from a center C1 of the sapphire substrate 13 toward a periphery of the sapphire substrate 13 as indicated by an arrow A, by controlling the Galvano mirror 20.

An interval of adjacent portions of the spiral is slightly smaller than a spot diameter of the pulsed laser beam, and the pulsed laser beam is preferably scanned in such a manner that part (preferably 60% to 80%) of the pulsed laser beam applied along a spiral locus overlaps with each other. However, application of the pulsed laser beam to the sapphire substrate 13 in the manner of forming the spiral locus is not limited to the scanning by the Galvano mirror 20, but may be realized by other laser beam scanning means or by spirally moving the chuck table 10 while fixing the condenser 18.

With the pulsed laser beam scanned in this way, the pulsed laser beam is applied to a region corresponding to the whole surface of the buffer layer 21. As a result, GaN constituting the buffer layer 21 is separated into Ga and $N_2$ gas, and due to the generated gas being confined in the sapphire substrate 13, a stress is generated. When the application of the pulsed laser beam reaches an outermost periphery of the sapphire substrate 13 and the buffer layer breaking step is finished, the stress is relieved simultaneously with the end of the buffer layer breaking step. Therefore, by a reaction force generated when the stress is relieved, the optical device layer 15 can be peeled from the sapphire substrate 13 and transferred onto the transfer substrate 27, without application of any external force such as ultrasonic waves.

Figure 6B:
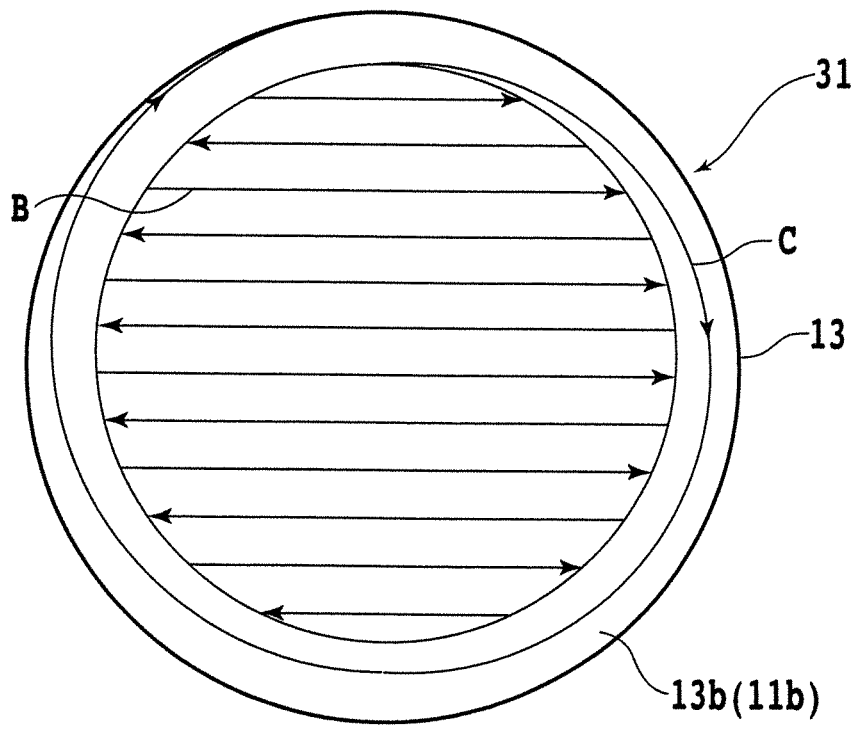
FIG. 6B is a schematic plan view illustrating a second embodiment in which the buffer layer breaking step is linearly conducted at a central portion of the epitaxy substrate and thereafter a peripheral portion of the epitaxy substrate is spirally processed.

FIG. 6B illustrates a plan view of a second embodiment of the buffer layer breaking step. In the second embodiment, the pulsed laser beam is linearly applied to a central portion exclusive of a peripheral portion of the sapphire substrate 13 as indicated by arrows B, thereby performing a first buffer layer breaking step.

In the present embodiment, also, the linear application of the pulsed laser beam is preferably conducted in such a manner that part of the laser spot diameter overlaps with each other. As a result, GaN constituting the buffer layer 21 is separated into Ga and $N_2$ gas, with a stress generated inside the sapphire substrate 13, and in the first buffer layer breaking step, this stress is kept confined in the inside of the composite substrate 31.

After the linear application of the pulsed laser beam is finished, a second buffer layer breaking step is carried out in which the pulsed laser beam is applied in such a manner as to form a spiral locus toward the periphery of the sapphire substrate 13 as indicated by an arrow C.

When the application of the pulsed laser beam reaches the outermost periphery of the sapphire substrate 13, in other words, when the second buffer layer breaking step is finished, the $N_2$ gas having been confined inside the sapphire substrate 13 is discharged and a stress is relieved. This relieved stress generates a reaction force, and therefore, the optical device layer 15 can be peeled from the sapphire substrate 13 and transferred onto the transfer substrate 27, without applying any external force such as ultrasonic waves.

In the buffer layer breaking step described above, it is necessary to confine the stress, which is generated due to generation of the $N_2$ gas attendant on the breakage of the buffer layer 21, inside the composite substrate 31, and to relieve the stress simultaneously with the end of the buffer layer breaking step. Therefore, a thin sapphire substrate 13 may be broken by the stress due to the confined gas; in view of this, the thickness of the sapphire substrate 13 is preferably in the range of 0.5 to 1.5 mm.

The buffer layer breaking step is preferably performed, for example, in the following laser processing conditions.
Light source: YAG pulsed laser or YVO4 pulsed laser
Wavelength: 257 nm
Repetition frequency: 50 to 200 kHz
Average output: 0.1 to 2.0 W
Pulse energy: 0.5 to 10 µJ
Spot diameter: 10 to 50 µm
Scanning speed of laser beam: 50 to 100 mm/s In the buffer layer breaking step according to the embodiments of the present invention, the stress due to the $N_2$ gas generated in the buffer layer breaking step is confined in the inside of the composite substrate, the stress is relieved by discharging the $N_2$ gas simultaneously with the end of the buffer layer breaking step, and the optical device layer 15 is peeled from the sapphire substrate 13 by the reaction force of the relieved stress. Therefore, it is important to conduct the application of the pulsed laser beam from the center toward the periphery of the sapphire substrate 13, and to relieve the stress due to the $N_2$ gas simultaneously with the end of the buffer layer breaking step.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A lift-off method of transferring onto a transfer substrate an optical device layer of an optical device wafer having the optical device layer formed over a front surface of an epitaxy substrate through a GaN buffer layer, the lift-off method comprising:
    a transfer substrate bonding step of bonding the transfer substrate onto a front surface of the optical device layer of the optical device wafer through a bonding layer, to form a composite substrate;
    a buffer layer breaking step of applying a pulsed laser beam of such a wavelength as to be transmitted through the epitaxy substrate of the optical device wafer constituting the composite substrate and absorbed in the buffer layer formed on the epitaxy substrate from a back surface side of the epitaxy substrate, to break the buffer layer via a reaction force generated when a stress generated by separation of GaN constituting the buffer layer into Ga and $N_2$ gas is relieved; and
    an optical device layer transferring step of peeling the optical device layer from the epitaxy substrate and transferring the optical device layer onto the transfer substrate, after the buffer layer breaking step is performed,
    wherein the buffer layer breaking step includes a first applying step of applying the pulsed laser beam to a central portion of the epitaxy substrate, excluding a peripheral portion of the epitaxy substrate completely surrounding the central portion, so, so that the stress generated by the separation of GaN is confined within the optical device wafer by the peripheral portion, and a second applying step of applying the pulsed laser beam on the peripheral portion after the first applying step, so that the stress is relieved simultaneously at the end of the buffer layer breaking step, whereby the optical device layer is peeled from the epitaxy substrate, and transferred onto the transfer substrate.

2. The lift-off method according to claim 1, wherein the epitaxy substrate has a thickness in a range of 0.5 to 1.5 mm.

3. The lift-off method according to claim 1, wherein the reaction force does not include an external force acting on the optical device wafer.

4. The lift-off method according to claim 1, wherein the pulsed laser beam is applied in a spiral pattern starting at a center of the epitaxy substrate in the first applying step and extending along the peripheral portion in the second applying step.

5. The lift-off method according to claim 4, wherein adjacent applications of the pulsed laser beam overlap each other.

6. The lift-off method according to claim 5, wherein the adjacent applications of the pulsed laser beam overlap by about 60% to 80%.

7. The lift-off method according to claim 1, wherein the pulsed laser beam is applied in a linear pattern within the central portion of the epitaxy substrate in the first applying step and along the peripheral portion of the epitaxy substrate in the second applying step.

* * * * *